United States Patent
Le Prado et al.

(10) Patent No.: US 11,237,232 B2
(45) Date of Patent: Feb. 1, 2022

(54) ZERO FIELD SERVO-CONTROLLED MAGNETOMETER WITH LOW FREQUENCY FILTERING OF THE COMPENSATION FIELD

(71) Applicant: COMMISSARIAT À L'ÉNERGIE ATOMIQUE ET AUX ÉNERGIES ALTERNATIVES, Paris (FR)

(72) Inventors: Matthieu Le Prado, Grenoble (FR); Agustin Palacios Laloy, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/812,664

(22) Filed: Mar. 9, 2020

(65) Prior Publication Data

US 2020/0292639 A1    Sep. 17, 2020

(30) Foreign Application Priority Data

Mar. 12, 2019 (FR) ...................................... 1902495

(51) Int. Cl.
*G01R 33/26* (2006.01)
(52) U.S. Cl.
CPC ................... *G01R 33/26* (2013.01)
(58) Field of Classification Search
CPC ........ G01R 33/26; G01R 33/24; G01R 33/20; G01R 33/032
See application file for complete search history.

(56) References Cited

U.S. PATENT DOCUMENTS

| 9,797,966 B2 * | 10/2017 | Le Prado | ............... G01R 33/04 |
| 2010/0259256 A1 | 10/2010 | Le Prado et al. | |

(Continued)

FOREIGN PATENT DOCUMENTS

| EP | 3364204 A1 * | 8/2018 | ............ G01R 33/26 |
| FR | 3056761 B1 | 9/2018 | |
| SU | 739453 A1 * | 6/1980 | |

OTHER PUBLICATIONS

Preliminary French Search Report for French application No. 1902495 dated Nov. 22, 2019.

(Continued)

*Primary Examiner* — Jay Patidar
(74) *Attorney, Agent, or Firm* — Pearne & Gordon LLP

(57) ABSTRACT

A magnetometer is provided which measures an ambient magnetic field having a frequency range of interest. An optical pumping source emits in the direction of a cell filled with an atomic gas a light beam linearly polarised in a polarisation direction. A parametric resonance excitation circuit induces in the cell a radiofrequency magnetic field having two components orthogonal to the polarisation direction and each oscillating at its own oscillation frequency. A parametric resonance detection circuit performs synchronous detection at an inter-harmonic of oscillation frequencies of an electrical signal outputted by a photodetector arranged to receive the light beam having passed through the cell. A zero-field servo-control circuit generates from the synchronous detection a compensation magnetic field opposite to a component of the ambient magnetic field oriented in the polarisation direction. The servo-control circuit is configured so the compensation magnetic field has an attenuation within the frequency range of interest.

8 Claims, 1 Drawing Sheet

(56) References Cited

U.S. PATENT DOCUMENTS

| | | | |
|---|---|---|---|
| 2010/0315173 A1 | 12/2010 | Le Prado et al. | |
| 2012/0062221 A1* | 3/2012 | Le Prado | G01C 25/005 |
| | | | 324/244 |
| 2014/0368193 A1 | 12/2014 | Morales et al. | |
| 2015/0008916 A1 | 6/2015 | Le Prado et al. | |
| 2016/0084925 A1 | 3/2016 | Le Prado et al. | |
| 2016/0116553 A1* | 4/2016 | Kim | G01R 33/032 |
| | | | 324/305 |
| 2017/0010337 A1 | 1/2017 | Morales et al. | |
| 2018/0164102 A1 | 6/2018 | Morales et al. | |
| 2018/0188334 A1 | 7/2018 | Le Prado et al. | |
| 2019/0003833 A1 | 1/2019 | Palacios Laloy | |
| 2019/0074660 A1 | 3/2019 | Beato et al. | |
| 2019/0107395 A1 | 4/2019 | Palacios Laloy et al. | |
| 2019/0250223 A1 | 8/2019 | Palacios Laloy | |
| 2020/0018802 A1 | 1/2020 | Palacios Laloy | |
| 2020/0072916 A1* | 3/2020 | Alford | G01R 33/26 |

OTHER PUBLICATIONS

Morales, s. et al. "Magnetocardiography measurements with $^4$He vector optically pumped magnetometers at room temperature" In: Physics in Medicine and Biology, Institute of Physics Publishing, Aug. 21, 2017, vol. 62, No. 18, pp. 7267-7279.

Dupont-Roc, J. "Détermination par des méthodes optiques des trois composantes d'un champ magnétique très faible," Revue de Physique Appliquée, 1970, vol. 5, No. 6, pp. 853-864. Publication Includes English Abstract.

Specification and drawings for U.S. Appl. No. 16/675,828 entitled "Compact Hanle Effect Magnetometer", filed Nov. 6, 2019.

* cited by examiner

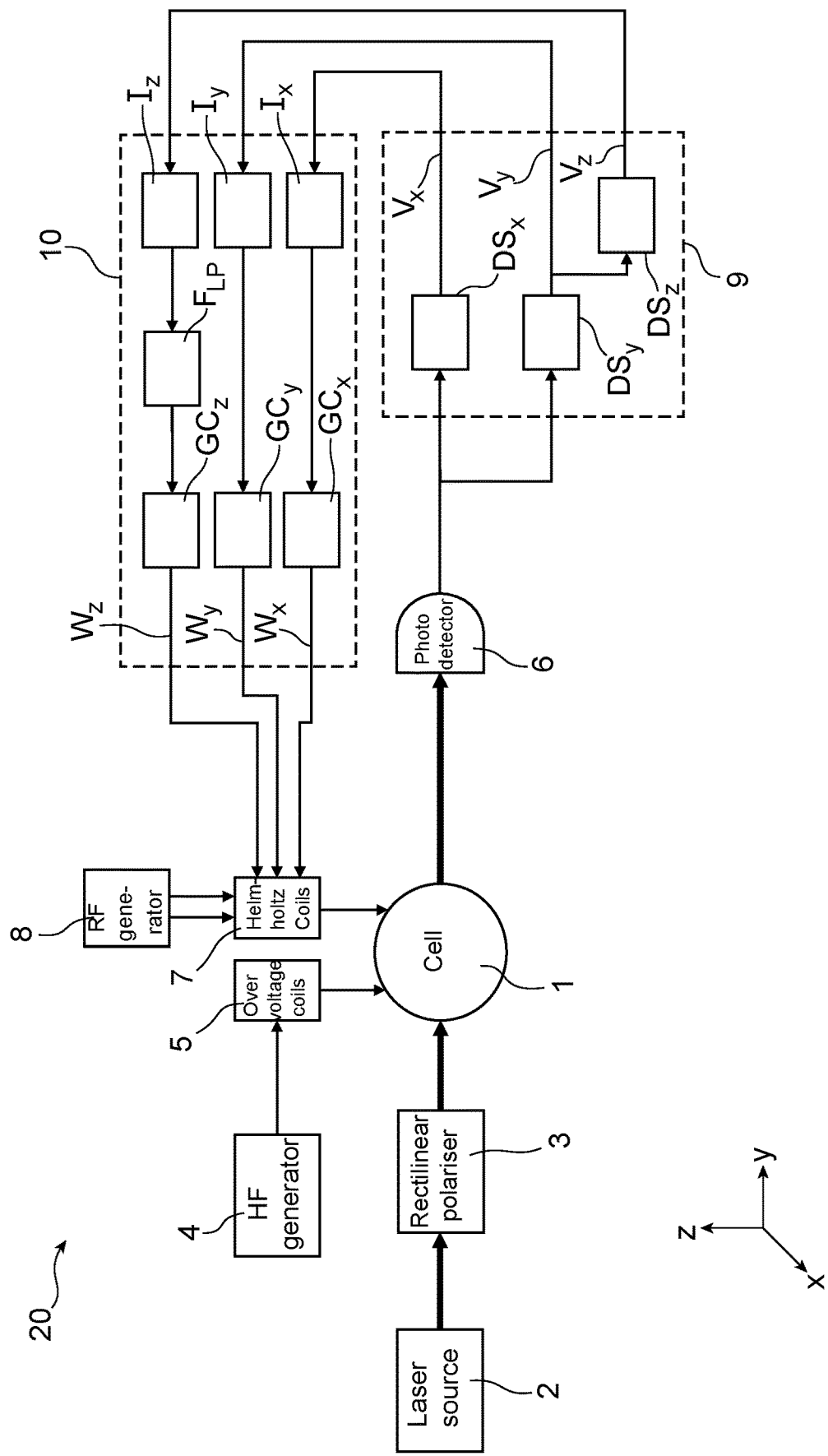

ZERO FIELD SERVO-CONTROLLED MAGNETOMETER WITH LOW FREQUENCY FILTERING OF THE COMPENSATION FIELD

CROSS-REFERENCE TO RELATED APPLICATIONS

This application claims priority from French Patent Application No. 1902495 filed on Mar. 12, 2019. The content of this application is incorporated herein by reference in its entirety.

TECHNICAL FIELD

The field of the invention is that of zero field servo-controlled optically pumped magnetometers. In particular, the invention finds application for magnetic imaging of the brain or the heart by means of magnetometers deployed in a network.

PRIOR ART

Optically pumped magnetometers use atomic gases confined in a cell, typically metastable helium or alkaline gases, as the sensitive element. These magnetometers, which can take different configurations, allow measuring the magnetic field by exploiting the following three processes which take place either sequentially or concomitantly:

1) The use of polarised light sources, typically lasers, allow preparing atomic states characterised by a certain orientation or alignment of their spins. This process is called "optical pumping" in the field.

2) These atomic states evolve under the effect of the magnetic field, in particular under the Zeeman effect, which corresponds to shifts in energy levels depending on the magnetic field to which the atoms are subjected.

3) The optical properties of the atomic medium then undergo modifications which depend on the state of the atoms. Thus, one can by an optical measurement, for example by an optical absorption measurement, go back to the undergone Zeeman shift, and deduce therefrom a measurement of the magnetic field wherein the cell is immersed.

According to the different possible configurations of existing optical pumping magnetometers, there is distinguished a measurement of the module, also called standard, of the magnetic field for scalar magnetometers, or a determination of the different components of the magnetic field for vector magnetometers.

To carry out a vector measurement of the magnetic field with a wide bandwidth, there are two well-known configurations: the first known as "Hanle effect" and the second which is called "parametric resonance magnetometer". These configurations are described in particular in the article by J. Dupont-Roc, "Détermination par des méthodes optiques des trois composantes d'un champ magnétique très faible," Revue de Physique Appliquée, vol. 5, no. 6, pp. 853-864, 1970. They operate at very low external magnetic field values, inducing a Zeeman shift smaller than the relaxation rate of the Zeeman sub-levels of the atom, which in the case of helium fixes a limit around 100 nano Tesla, 500 times less intense than the Earth's magnetic field.

When a weak transverse static magnetic field is applied to the cell and swept around zero, the atoms are subjected to a movement of precession and the number of absorbed photons, coming from the optical pumping laser, undergoes resonant variations (Hanle effect). Similar resonances, called parametric resonances, are observed when a frequency modulated magnetic field (called radiofrequency field) is applied. Under these conditions, the magnetic moment of each atom undergoes resonant oscillations at frequencies multiple of that of the radiofrequency field.

The parametric resonance magnetometer allows the three components of the ambient magnetic field to be deduced independently, which makes vector measurement possible. The two components parallel to the axis of application of two radiofrequency fields are thus obtained by measuring the amplitude of the photo-detection signal at the oscillation frequency of the corresponding radiofrequency field and in quadrature therewith. Indeed, this amplitude is directly proportional to the magnetic field parallel to the axis of the corresponding radio frequency field. It is also possible to obtain the third component of the magnetic field (perpendicular to the two RF fields) because the first inter-harmonic of the two oscillation frequencies of the radiofrequency fields is proportional to the amplitude of this third component. However, the proportionality factors for the measurement of this third axis are strongly unfavourable compared to the first two. Thus, the noise associated with the measurement of the field along this third axis is typically three to eight times higher than that associated with the other two axes.

In these two configurations, it is advantageous to operate the magnetometer "in closed loop" by constantly subjecting the sensitive element to a zero total magnetic field. This operation called zero-field servo-control operation in particular has the advantage of being less sensitive to the variation of the parameters impacting the properties of the magnetometer (laser power, density of the sensitive element, . . . ).

The zero total magnetic field is obtained by generating compensation magnetic fields by injecting currents into suitable coils which surround the sensitive element. These compensation fields cancel each of the components of the ambient magnetic field by means of a closed-loop regulation of the injected currents. The measurement of the currents circulating in the coils allows deducing the fields that it is necessary to apply to cancel the various components of the ambient field, and therefore to have the value of these various components of the ambient field.

In the context of a network of magnetometers, the compensation magnetic fields generated by the coils of a magnetometer are also seen by the other magnetometers of the network, particularly the closest magnetometers. They disturb the measurements made by the other magnetometers of the network by bringing both bias and additional noise.

A solution for compensating for the biases thus induced has been proposed in patent FR 3056761 B1. If this solution allows correcting the accuracy of the measurements carried out by the magnetometers of the network, it does not allow reducing the risk that the excess noise induced by the compensation fields causes erroneous or saturated measurements.

DESCRIPTION OF THE INVENTION

The invention aims at reducing the noise which affects the measurements carried out by a magnetometer belonging to a network of magnetometers, in particular the noise induced by the compensation fields generated by the other magnetometers of the network. To this end, it provides a magnetometer intended for the measurement of an ambient magnetic field having a frequency range of interest, comprising:

an optical pumping source arranged to emit in the direction of a cell filled with an atomic gas a light beam linearly polarised in a polarisation direction, a parametric resonance excitation circuit configured so as to induce in the cell a radiofrequency magnetic field having two components orthogonal to the direction of polarisation and each oscillating at its own oscillation frequency, a parametric resonance detection circuit configured to perform synchronous detection, at an inter-harmonic of the oscillation frequencies, of an electrical signal outputted by a photodetector arranged to receive the light beam having passed through the cell, a zero-field servo-control circuit configured to generate from said synchronous detection a compensation magnetic field opposite to a component of the ambient magnetic field oriented in the direction of polarisation.

Said servo-control circuit is configured so that the compensation magnetic field has an attenuation within the frequency range of interest.

Some preferred but non-limiting aspects of this magnetometer are the following:

said servo-control circuit comprises a low-pass filter which has a cut-off frequency selected to attenuate the compensation magnetic field within the frequency range of interest;

said servo-control circuit comprises an integrator configured to output a compensation signal, a current generator capable of being piloted by the compensation signal to inject current into a coil, the low-pass filter being interposed between the integrator and the coil;

the low-pass filter is interposed between the integrator and the current generator;

the low-pass filter is a digital filter, for example a 4-order Butterworth filter.

BRIEF DESCRIPTION OF THE DRAWINGS

Other aspects, purposes, advantages and features of the invention will appear better upon reading the following detailed description of preferred embodiments thereof, given as a non-limiting example, and made with reference to the appended drawing on which:

FIG. 1 shows a diagram of a magnetometer in accordance with the invention.

DETAILED DESCRIPTION

With reference to FIG. 1, the invention relates to a vector optically pumped magnetometer 20 which comprises a cell 1 filled with an atomic gas, for example helium-4 or an alkaline gas, subjected to an ambient magnetic field whose projection on three axes of rectangular coordinates x, y, z defines three components. The ambient magnetic field is thus decomposed into three components Bx, By and Bz each along one of the measurement axes of the magnetometer x, y and z. The ambient field has a frequency range of interest, for example comprised between 1 and 200 Hz for magnetocardiography or magnetoencephalography (MEG) applications.

The cell is illuminated by an optical pumping source 2, 3 arranged to emit a light beam in the direction of the cell 1, for example a laser beam, tuned to a pump wavelength (this beam is thus also designated by pump beam) and linearly polarised. The pump wavelength is set on an atomic transition line, for example on the line $D_0$ at 1083 nm in the case of helium-4. The light beam can be emitted by a laser source 2 and be linearly polarised by means of a rectilinear polariser 3 interposed between the laser source 2 and the cell 1 or directly integrated into the laser source 2. The light beam propagates according to a direction of propagation coincident with the x axis, and is linearly polarised along the z axis.

In the case where the sensitive element is helium-4, the magnetometer 20 moreover includes a high frequency discharge (HF) system, comprising an HF generator 4 and overvoltage coils 5, for bringing the atoms of the atomic gas in an energised state where they are capable of undergoing the atomic transition when they are illuminated by the light beam, typically in the metastable state $2^3S_1$.

The magnetometer 20 also comprises a parametric resonance excitation circuit which includes a radiofrequency generator 8 which supplies Helmholtz coils 7 of orthogonal axes which surround the cell in order to generate a magnetic field for exciting parametric resonances, also designated by excitation radio frequency field. This excitation circuit more particularly generates a radiofrequency magnetic field having two components orthogonal to the direction of polarisation and each oscillating at its own oscillation frequency, namely a component $B_\omega \cos\omega t$ along the x axis oscillating at the pulsation $\omega$ (with for example $\omega=2\pi.3000$ kHz) and a component $B_\Omega \cos\Omega t$ along the y axis oscillating at the pulsation $\Omega$ (with for example $\Omega=2\pi.16$ kHz). These components lead to resonances at each of the oscillation frequencies $\Omega/2\pi$, $\omega/2\pi$ and to an inter-harmonic of the oscillation frequencies $(\omega\pm\Omega)/2\pi$, these resonances being associated with the values of the ambient field in the x, y and z directions respectively.

The magnetometer 20 moreover comprises a photodetector 6 arranged to receive the light beam having passed through the cell and a parametric resonance detection circuit 9 configured to perform a synchronous detection, at a harmonic of each of the oscillation frequencies, of an electrical signal outputted by the photodetector and a synchronous detection, at an inter-harmonic of the oscillation frequencies, of the electrical signal outputted by the photodetector. The device 9 includes three detection channels: a first channel Vx for the detection of the signal at $\Omega/2\pi$ (x axis), a second channel Vy for the detection of the signal at $\omega/2\pi$ (y axis), and a third channel Vz for the detection of the signal at $\Omega\pm\omega/2\pi$ (z axis). The signal on each of the first and second channels Vx, Vy is first amplified and then filtered with a band-pass filter corresponding to the appropriate central frequency (i.e. corresponding to that of the applied RF field). The signal obtained is then multiplied by a reference signal and processed by a synchronous detector DSx, DSy. The third channel Vz uses two synchronous detections in series, one at $\omega/2\pi$ by means of the detector DSy of the second channel Vy and the other at $\Omega/2\pi$ by means of a synchronous detector DSz.

The magnetometer 20 also comprises a servo-control circuit 10 of the zero-field magnetometer. This system comprises three servo-control channels Wx, Wy, Wz each coupled to an output of a corresponding detection channel Vx, Vy, Vz.

Each of the servo-control channels Wx, Wy, Wz uses the output of the corresponding detection channel as an error signal to constantly readjust a compensation field. Each of the servo-control channels Wx, Wy, Wz comprises an integrator Ix, Iy, Iz configured to output a compensation signal and a current generator GCx, GCy, GCz piloted by the compensation signal to inject current into one of the three Helmholtz coils 7 and generate a compensation magnetic field BCx, BCy, BCz opposite to a component of the ambient field Bx, By, Bz. The measurement of the currents circulating in the coils 7 allows deducing the fields that it is necessary to apply to cancel the various components of the ambient field, and therefore to have the value of these various components.

As previously seen, the noise associated with the measurement of the ambient field along the z axis is typically at least an order of magnitude higher than that associated with the other two axes, for example 4 times greater. Consequently, the compensation magnetic field BCz opposite to the component Bz of the ambient magnetic field oriented in the direction of polarisation is the noisiest, and is therefore the most likely to disturb the measurements carried out by magnetometers arranged in the proximity of the magnetometer 20 according to the invention. In order to limit these disturbances, the invention proposes to configure the servo-control circuit so that the compensation magnetic field BCz has an attenuation within the frequency range of interest. By carrying out such an attenuation, the impact of the noise carried the compensation field along the z axis is reduced within the range of interest without altering the compensation function of the component of the ambient magnetic field oriented in the direction of polarisation, the ambient field being indeed mainly static.

Such an attenuation can be obtained by providing the servo-control circuit 10 with a low-pass filter $F_{LP}$ which has a cut-off frequency selected to attenuate the compensation magnetic field within the frequency range of interest, for example a cut-off frequency selected to cut the compensation magnetic field beyond 0.5 Hz for a frequency range of interest comprised between 1 and 200 Hz.

The low-pass filter can in particular be arranged on the compensation channel Wz after the integrator Iz, thus by being interposed between the integrator Iz and the corresponding coil of the set of coils 7. As shown in FIG. 1, the low-pass filter $F_{LP}$ can in particular be interposed between the integrator Iz and the current generator GCz. It may be a digital filter arranged upstream of a digital-to-analogue converter disposed for example at the input of the current generator, or else an analogue filter arranged downstream of such a digital-to-analogue converter and applied on a voltage or a current. The low-pass filter can be a Butterworth filter, for example of order 4. With a Butterworth filter of order 4 and cut-off frequency 0.5 Hz, the additional noise is attenuated by a factor of 16 to 1 Hz at further beyond this frequency within the range of interest. The noise carried by the noisiest z axis, initially 4 times greater, then becomes $4/16$, that is to say 4 times lower than the noise carried by the other x, y axes. The z axis can thus be used to servo-control the magnetic field around zero while avoiding bringing noise into the range of interest of the measurement carried out by the other magnetometers of the network.

According to the invention, such an attenuation of the compensation magnetic field in the frequency range of interest can also be carried out for one or both of the other x and y measurement axes, and this independently or not of an attenuation performed on the z axis. The invention further extends to a magnetometry device comprising a network of magnetometers at least one of which is as described previously. It also relates to a method for servo-controlling, in a zero field, a magnetometer as described previously, comprising in particular a step which can be implemented by computer consisting in controlling the generation of the compensation magnetic field so that it is attenuated within the frequency range of interest.

The invention claimed is:

1. A magnetometer for the measurement of an ambient magnetic field having a frequency range of interest, comprising:
    an optical pumping source arranged to emit a light beam in the direction of a cell filled with an atomic gas, wherein the light beam is linearly polarised in a polarisation direction,
    a parametric resonance excitation circuit configured so as to induce in the cell a radiofrequency magnetic field having two components orthogonal to the polarisation direction and each oscillating at its own oscillation frequency,
    a parametric resonance detection circuit configured to perform synchronous detection, at an inter-harmonic of the oscillation frequencies, of an electrical signal outputted by a photodetector arranged to receive the light beam having passed through the cell, and
    a zero-field servo-control circuit configured to generate from the performed synchronous detection of said electrical signal a compensation magnetic field opposite to a component of the ambient magnetic field oriented in the polarisation direction,
    wherein said zero-field servo-control circuit is configured so that the compensation magnetic field has an attenuation within the frequency range of interest.

2. The magnetometer according to claim 1, wherein said zero-field servo-control circuit comprises a low-pass filter which has a cut-off frequency selected to attenuate the compensation magnetic field within the frequency range of interest.

3. The magnetometer according to claim 2, wherein said zero-field servo-control circuit comprises an integrator configured to output a compensation signal, a current generator configured to be piloted by the compensation signal to inject current into a coil, the low-pass filter being interposed between the integrator and the coil.

4. The magnetometer according to claim 3, wherein the low-pass filter is interposed between the integrator and the current generator.

5. The magnetometer according to claim 4, wherein the low-pass filter is a digital filter.

6. The magnetometer according to claim 5, wherein the low-pass filter is a 4-order Butterworth filter.

7. A magnetometry device comprising a network of magnetometers, at least one of which is a magnetometer according to claim 1.

8. A method for servo-controlling, in a zero field, a magnetometer that measures an ambient magnetic field having a frequency range of interest, the magnetometer including:
    an optical pumping source arranged to emit a light beam in the direction of a cell filled with an atomic gas, wherein the light beam is linearly polarised in a polarisation direction,
    a parametric resonance excitation circuit configured so as to induce in the cell a radiofrequency magnetic field having two components orthogonal to the polarisation direction and each oscillating at its own oscillation frequency,
    a parametric resonance detection circuit configured to perform synchronous detection, at an inter-harmonic of the oscillation frequencies, of an electrical signal outputted by a photodetector arranged to receive the light beam having passed through the cell,
    a zero-field servo-control circuit configured to generate from the performed synchronous detection of said electrical signal a compensation magnetic field opposite to a component of the ambient magnetic field oriented in the direction of polarisation,
wherein the method includes a step consisting in controlling the generation of the compensation magnetic field so that it is attenuated within the frequency range of interest.

* * * * *